(12) United States Patent
Fang et al.

(10) Patent No.: US 11,799,024 B2
(45) Date of Patent: Oct. 24, 2023

(54) SEMICONDUCTOR DEVICE AND PREPARATION METHOD THEREFOR

(71) Applicant: CHINA RESOURCES MICROELECTRONICS (CHONGQING) CO., LTD., Chongqing (CN)

(72) Inventors: Dong Fang, Jiangsu (CN); Kui Xiao, Jiangsu (CN); Zheng Bian, Jiangsu (CN); Jinjie Hu, Jiangsu (CN)

(73) Assignee: CHINA RESOURCES MICROELECTRONICS (CHONGQING) CO., LTD., Chongqing (CN)

( * ) Notice: Subject to any disclaimer, the term of this patent is extended or adjusted under 35 U.S.C. 154(b) by 0 days.

(21) Appl. No.: 17/926,357

(22) PCT Filed: Dec. 28, 2020

(86) PCT No.: PCT/CN2020/139987
§ 371 (c)(1),
(2) Date: Nov. 18, 2022

(87) PCT Pub. No.: WO2021/232796
PCT Pub. Date: Nov. 25, 2021

(65) Prior Publication Data
US 2023/0135315 A1   May 4, 2023

(30) Foreign Application Priority Data

May 18, 2020  (CN) .......................... 202010418489.X

(51) Int. Cl.
*H01L 29/739*   (2006.01)
*H01L 29/06*    (2006.01)
(Continued)

(52) U.S. Cl.
CPC ........ *H01L 29/7397* (2013.01); *H01L 29/063* (2013.01); *H01L 29/1095* (2013.01);
(Continued)

(58) Field of Classification Search
CPC .............. H01L 29/7397; H01L 29/063; H01L 29/1095; H01L 29/407; H01L 29/41708; H01L 29/66348
(Continued)

(56) References Cited

U.S. PATENT DOCUMENTS

| 9,024,379 | B2* | 5/2015 | Darwish | ............. H01L 29/1095 |
| | | | | 257/334 |
| 2006/0209887 | A1* | 9/2006 | Bhalla | ................. H01L 29/7811 |
| | | | | 257/E29.066 |
| 2019/0122926 | A1* | 4/2019 | Darwish | ............. H01L 29/4916 |

FOREIGN PATENT DOCUMENTS

| CN | 101048874 A | 10/2007 |
| CN | 108346701 A | 7/2018 |

(Continued)

*Primary Examiner* — Igwe U Anya
(74) *Attorney, Agent, or Firm* — Global IP Services; Tianhua Gu

(57) ABSTRACT

A preparation method for semiconductor device, comprising: forming a body region (110) in the drift region (100), forming a first doped region (111) and a second doped region (112) in the body region (110); forming a first trench (171) penetrating the first doped region (111) and the body region (110) and extending to the drift region (100); forming an extension region (150) with a conductivity type opposite to that of the drift region (100) and surrounding the bottom wall of the first trench (171); filling the first trench (171) with a dielectric layer (130) formed on the sidewall of the trench, a first conductive structure (141) located at the bottom of the trench and a second conductive structure (142) located at the top of the trench; forming a second trench (172) penetrating the body region (110) and extending into (Continued)

the drift region (100); filling the second trench (172) with a third conductive structure (143) and a dielectric layer (130) formed on the inner wall of the trench. The second conductive structure (142) is electrically connected with the gate, and the first doped region (111), the second doped region (112), and the third conductive structure (143) are electrically connected with the first electrode (130).

14 Claims, 9 Drawing Sheets

(51) Int. Cl.
  *H01L 29/10* (2006.01)
  *H01L 29/40* (2006.01)
  *H01L 29/417* (2006.01)
  *H01L 29/66* (2006.01)
(52) U.S. Cl.
  CPC ...... *H01L 29/407* (2013.01); *H01L 29/41708* (2013.01); *H01L 29/66348* (2013.01)
(58) Field of Classification Search
  USPC .......................................................... 257/139
  See application file for complete search history.

(56) References Cited

FOREIGN PATENT DOCUMENTS

| CN | 108400161 A | 8/2018 |
|---|---|---|
| CN | 110718546 A | 1/2020 |

\* cited by examiner

SEMICONDUCTOR DEVICE AND PREPARATION METHOD THEREFOR

CROSS REFERENCE TO RELATED PATENT APPLICATION

The present application is the US national stage of PCT/CN2020/139987 filed on 2020 Dec. 28, which claims the priority of the Chinese patent application No. 202010418489.X filed on 2020 May 18, which application is incorporated herein by reference.

FIELD OF TECHNOLOGY

The present invention relates to a field of semiconductor, particularly to a semiconductor device and a preparation method thereof.

BACKGROUND

The statements herein merely provide background information related to the present application and do not necessarily constitute the prior art.

MOS (Metal Oxide Semiconductor) transistors and other semiconductor devices integrated with MOS transistor structures have certain on-resistance when these devices are turned on, and the larger the on-resistance, the greater the power consumption of the devices, therefore, it is necessary to minimize the on-resistance. At present, a trench gate structure is usually employed. The conduction channel is changed from lateral to longitudinal by forming the trench gate structure, which greatly improves the density of the conduction channel and reduces the on-resistance. The doping concentration of the drift region needs to be increased to further reduce on-resistance on the basis of forming the trench gate structure. However, increasing the doping concentration will weaken the voltage endurance capability of the device. Therefore, it is difficult to further reduce the on-resistance of the device under the limitation of the voltage endurance capability.

SUMMARY

Accordingly, it is necessary to provide a new semiconductor device and a preparation method thereof in view of the current technical problem.

A semiconductor device, including:

A drift region with a first conductivity type;

A body region with a second conductivity type, formed in the drift region;

A first doped region and a second doped region, respectively formed in the body region, where the first doped region has the first conductivity type, the second doped region has the second conductivity type;

A trench gate and an extension region, where the trench gate is formed by filling a first trench, the first trench penetrates the first doped region, the body region and extends to the drift region; the extension region has the second conductivity type and is formed in the drift region located under the first trench, and surrounds the bottom wall of the first trench; the trench gate comprises a first conductive structure at the bottom of the first trench and a second conductive structure at the top of the first trench; a dielectric layer formed between the second conductive structure and the inner wall of the first trench, as well as between the first conductive structure and the inner wall of the first trench not surrounded by the extension region; the first conductive structure and the second conductive structure are isolated from each other;

A trench regulatory region, formed by filling a second trench, the second trench penetrates the body region and extends into the drift region, and the trench regulatory region includes a third conductive structure filled in the second trench and the dielectric layer between the third conductive structure and the inner wall of the second trench;

A gate, electrically connected with the second conductive structure;

A first electrode, electrically connected with the first doped region, the second doped region, and the third conductive structure;

A second electrode lead-out region, in contact with the drift region; and

A second electrode, electrically connected with the second electrode lead-out region.

The present application further provides a method for preparing semiconductor device, including:

Forming a drift region with a first conductivity type, forming a first trench in the drift region, and forming a dielectric layer on the inner wall of the first trench;

Doping dopants with a second conductivity type into the drift region at the bottom of the first trench through the first trench to form an extension region surrounding the bottom wall of the first trench;

Filling the first trench with a first conductive structure;

Simultaneously etching the first conductive structure inside the first trench and the drift regions on both sides of the first trench, removing the first conductive structure at the top of the first trench and retaining the first conductive structure at the bottom of the first trench; at the same time, forming second trenches on both sides of the first trench;

Filling the dielectric layer in the first trench and the second trench at the same time;

Simultaneously etching and removing part of the dielectric layer on the top of the first trench and the top of the second trench, retaining part of the dielectric layer on the first conductive structure and at the bottom of the second trench;

Simultaneously forming the dielectric layer on the exposed sidewalls of the first trench and the second trench, and then filling a conductive material into the first trench and the second trench at the same time to form a second conductive structure at the top of the first trench and a third conductive structure inside the second trench, respectively;

Doping the drift region with dopants with the second conductivity type, forming body regions on both sides of the first trench, doping the body regions with dopants with the first conductivity type and dopants with the second conductivity type to form a first doped region and a second doped region, respectively; and Forming a gate electrically connected with the second conductive structure, forming a first electrode electrically connected with the first doped region, the second doped region, and the third conductive structure, and leading out a second electrode by a second electrode lead-out region contacting the drift region.

The details of one or more embodiments of the present application are set forth in the accompanying drawings and the description below. Other features, objects and advantages of the present application will become apparent from the description, drawings and claims.

BRIEF DESCRIPTION OF THE DRAWINGS

In order to illustrate the technical solutions in the embodiments or exemplary technologies of the present application more clearly, the following briefly introduces the accompanying drawings required in the description of the embodiments or exemplary technologies. Obviously, the drawings in the following description are only used as some embodiments of the present application. For those of ordinary skill in the art, the drawings of other embodiments can also be obtained according to these drawings without creative efforts.

DETAILED DESCRIPTION

Figure 1:
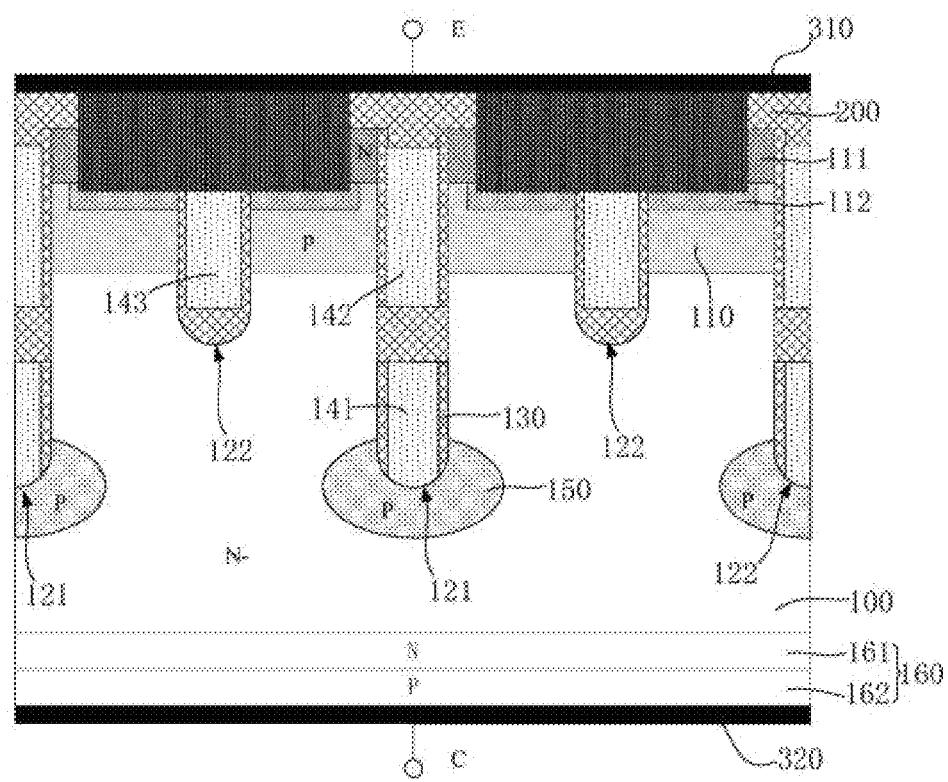
FIG. 1 shows a structure diagram in which a semiconductor device is IGBT and a first conductive structure is in contact with an extension region.

In order to facilitate the understanding of this application, the technical solutions of the present invention will be more fully described below with reference to the relevant drawings. An embodiment of the present invention is shown in the accompanying drawings. However, this application can be implemented in many other different ways and is not limited to the embodiments described herein. Therefore, the purpose of these embodiments is to make the disclosure of this application more thorough and comprehensive.

Unless otherwise defined, all technical and scientific terms used in the present invention have the same meaning as commonly understood by one skilled in the art. The terms used herein in the specification of this application are only for the purpose of describing specific embodiments and are not intended to limit this application. The term "and/or" as used herein includes one or more related listed items, and any combinations thereof.

A semiconductor device in the present invention is described below with reference to FIG. 1.

A semiconductor device, including:

a drift region 100, with a first conductivity type, and the drift region 100 may specifically be an epitaxial layer formed by epitaxial growth on a semiconductor substrate;

a body region 110, with a second conductivity type, is formed in the drift region 100, and is specifically formed on the upper surface layer of the drift region 100;

a first doped region 111 and a second doped region 112, respectively formed in the body region 100, where the first doped region 111 has the first conductivity type, the second doped region 112 has the second conductivity type, and the doping concentration of the second doped region 112 is higher than the doping concentration of the body region 110;

A trench gate 121 and an extension region 150, the trench gate 121 is formed by filling a first trench, where the first trench penetrates the first doped region 111 and the body region 110, and extends into the drift region 100, i.e., the bottom of the first trench is located in the drift region 100; the extension region 150 with the second conductivity type is formed in the drift region 100 below the first trench and surrounds the bottom wall of the first trench; the bottom of the first trench is filled with a first conductive structure 141 and the top of the first trench is filled with a second conductive structure 142, where the first conductive structure 141 and the second conductive structure 142 are isolated from each other; specifically, a dielectric layer can be formed between the first conductive structure 141 and the second conductive structure 142 to isolate the two conductive structures located at the upper and lower sides; the dielectric layer 130 is formed between the second conductive structure 142 and the inner wall of the first trench, and the dielectric layer 130 is also formed between the first conductive structure 141 and the inner wall of the first trench that is not surrounded by the extension region 150. It can be understood that the depth of the second conductive structure 142 needs to be greater than or equal to the depth of the body regions 110 on both sides to ensure conduction channels can be formed in the body regions 110 on both sides;

A trench regulatory region 122, is formed by filling a second trench, where the second trench penetrates the first doped region 111 and the body region 110, and extends into the drift region 100; The second trench is filled with a third conductive structure 143 and the dielectric layer 130 which is formed between the third conductive structure 143 and the inner wall of the second trench;

A gate (not shown in the figure), is electrically connected with the second conductive structure 142, where the second conductive structure 142 and the dielectric layers 130 on both sides of the second conductive structure 142 form a gate structure, the gate structure is connected with the gate. After obtaining an electric potential from the gate, the conduction channels can be formed in the body regions 110 on both sides of the gate structure;

A first electrode 310, is electrically connected with the first doped region 111, the second doped region 112, and the third conductive structure 143 of the trench regulatory region 122. A second electrode lead-out region 160 is in contact with the drift region 100 and leads out a second electrode 320. It can be understood that an interlayer dielectric layer 200 is further formed on each trench gate and doped region, and a first electrode 310 is electrically connected with the first doped region 111, the second doped region 112, and the third conductive structure 143 through a contact hole. After an electrical potential is applied to the gate and the conduction channel is formed in the body region 110, a current path can be formed between the first electrode 310 and the second electrode 320.

Specifically, the first conductive structure 141, the second conductive structure 142 and the third conductive structure 143 may be polysilicon, and the dielectric layer may be an oxide layer. The first conductivity type is P type, the second conductivity type is N type, or the first conductivity type is N type, and the second conductivity type is P type.

Regarding the above-mentioned semiconductor device, the trench gate 121 and the trench regulatory region 122 both extend into the drift region 100, and the trench regulatory region 122 accesses the potential of the first electrode 310, where the second conductive structure 142 at the top of the trench gate 121 is connected with the gate to form a gate structure, and the first conductive structure 141 at the bottom of the trench gate 121, the dielectric layer 130 and the trench regulatory region 122 extended to the drift region 100 are used as inner field plates located inside the drift region 100, through the inner field plates, the electric field in the drift region 100 can be adjusted to enhance the depletion of the drift region 100. On the other hand, the extension region 150 surrounding the bottom of the trench gate 121 is also formed in the drift region 100, and the conductivity type of the extension region 150 is opposite to that of the drift region 100, which also enhances the depletion of the drift region. Therefore, under the combined action of the above-mentioned inner field plate and the extension region, the depletion of the drift region 100 can be enhanced, thereby increasing the breakdown voltage of the drift region 100. Therefore, on the one hand, under the condition of having a same breakdown voltage, the doping concentration of the drift region of the semiconductor device in the present application can be increased, thereby reducing the on-resistance, that is, under the condition of having a same breakdown voltage, the semiconductor device in the present application can have a lower on-resistance and on-voltage drop. On the other hand, the extension region 150 surrounds the bottom of the first trench, which can transfer a breakdown position from the trench gate to the interface of the extension region 150 and the drift region 100, thereby making the breakdown more stable. At the same time, the combination use of the trench gate 121 and the trench regulatory region 122 can not only enhance the depletion of the drift region, but also minimize process costs as much as possible.

In an embodiment, as shown in FIG. 1, the trench gates 121 and the trench regulatory regions 122 are alternately distributed side by side, and further, the intervals between adjacent trenches are equal, for example, the interval between adjacent first trench and second trench is equal, the interval between adjacent first trenches is equal and the interval between adjacent second trenches is equal, so that the distribution of the inner field plate and the extension region is uniform. Therefore, the depletion regions in the drift region 110 are also uniformly distributed, and the voltage endurance capability of the device is further improved.

In an embodiment, as shown in FIG. 1, the depth of the second trench is smaller than that of the first trench, i.e., the depth of the trench regulatory region 122 is smaller than that of the first trench gate 121. Further, the bottom of the second trench is flush with the top of the first conductive structure 141. The dielectric layer in the second trench and the dielectric layer in the first trench and located above the first conductive structure 141 are formed synchronously by the same process, and the third conductive structure 143 in the second trench and the second conductive structure 142 in the first trench are also formed synchronously by the same process. In an embodiment, the upper part structure of the trench regulatory region 122 and the trench gate 121 are formed synchronously by the same process, thereby saving the process cost. The trench regulatory region 122 is relatively short, and the space occupied by the trench regulatory region 122 in the drift region 100 is small, thus avoiding a current crowding in the drift region 100 from affecting the current intensity.

In the present invention, the positional relationship of the first doped region 111, the second doped region 112, and the trench regulatory region 122 may have various forms.

In an embodiment, the first doped region 111 and the second doped region 112 may be arranged side by side, for example, the first doped region 111 and the second doped region 112 are both formed on the upper surface layer of the body region 110, and the second trench extends downward from the top surface of the body region 110 to the drift region 100, and the first doped region 111, the second doped region 112, and the third conductive structure 143 in the second trench are led out through different contact holes respectively and electrically connected with the first electrode 310.

In an embodiment, the second doped region 112 and the trench regulatory region 122 are both located below the first doped region 111. Specifically, as shown in FIG. 1, the first doped region 111 is formed on the upper surface layer of the body region 110, and the second doped region 112 is formed in the body region 110 below the first doped region 111 and is connected with the bottom surface of the first doped region 111; from the upper surface of the second doped region 112, the second trench sequentially penetrates the second doped region 112 and the body region 110, and extends into the drift region 100, and a contact hole is provided on the second trench, where the contact hole penetrates the first doped region 111 and exposes the second doped region 112 and the third conductive structure 143; and the first electrode 310 can be directly electrically connected with the first doped region 111, the second doped region 112, and the third conductive structure 143 only through one contact hole, thereby simplifying the structure. In another embodiment, the third conductive structure 143 is covered with the dielectric layer; the contact hole penetrates the first doped region 111 and exposes the second doped region 112 and the dielectric layer; the first electrode 310 is in contact with the first doped region 111, the second doped region 112 and the dielectric layer respectively through the contact hole, and the first electrode 310 can enable the third conductive structure 143 to generate an induced electromotive force through the dielectric layer, at the same time, the dielectric layer can avoid the electrical leakage of the first electrode 310. Further, when an interlayer dielectric layer 200 is formed under the first electrode 310, the contact hole needs to penetrate the interlayer dielectric layer 200.

In this application, the first conductive structure 141 may be a floating structure (without connecting to a potential), or may be electrically connected with the first electrode 310 to obtain the potential of the first electrode 310. For the case where the first conductive structure 141 and the first electrode 310 are electrically connected, specifically, the first conductive structure 141 can be led out from one end of the first trench, and then directly electrically connected with the first electrode 310 through the contact hole, or a dielectric layer can be provided between the first conductive structure 141 and the first electrode 310 with a thickness that can enable the first conductive structure 141 to obtain the induced electromotive force from the first electrode 310. When the first conductive structure 141 and the first electrode 310 are electrically connected in an inductive manner, the first conductive structure 141 can obtain an induced potential, and the leakage path between the first electrode 310 and the first conductive structure 141 can be cut off to avoid electrical leakage of the first electrode 310. In an embodiment, when the first conductive structure 141 is electrically connected with the first electrode 310, the parasitic capacitance between the gate and the second electrode 320 can be reduced.

In this application, the specific designs of the trench gate 121 and the extension region 150 may have various forms.

In an embodiment, as shown in FIG. 1, a dielectric layer 130 is formed between the first conductive structure 141 and the inner wall of the first trench not surrounded by the extension region 150, and at least part of the bottom wall of the first trench surrounded by the extension region 150 is not covered by the dielectric layer, i.e., the extension region 150 is in contact with the first conductive structure 141. In this case, the extension region 150 and the first conductive structure 141 have the same potential. If the first conductive structure 141 is a floating structure, then the extension region 150 is also a floating structure; if the first conductive structure 141 is electrically connected with the first electrode 310, then the extension region 150 is also electrically connected with the first electrode 310 through the first conductive structure 141 to have a certain potential, so that the depletion of the drift region 100 can be further enhanced.

Figure 2:
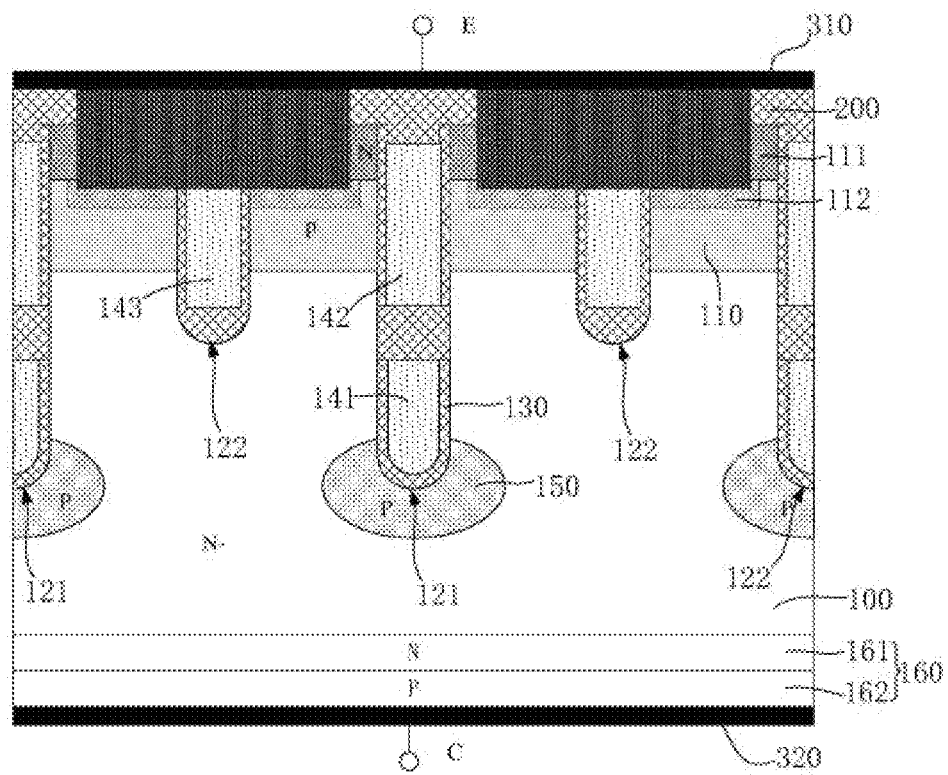
FIG. 2 shows a structure diagram in which the semiconductor device is IGBT and the first conductive structure is isolated from the extension region.

In an embodiment, as shown in FIG. 2, the dielectric layer 130 is formed between the first conductive structure 141 and the inner wall of the first trench not surrounded by the extension region 150, and the bottom wall of the first trench surrounded by the extension region 150 is also covered by the dielectric layer, i.e., the dielectric layer 130 is formed on the entire inner wall of the first trench, and the extension region 150 is isolated from the first conductive structure 141 by the dielectric layer 130. In this case, whether the first conductive structure 141 is charged or not, the extension region 150 has a floating structure, thereby further avoiding the electrical leakage of the electrode.

In an embodiment, as shown in FIGS. 1 and 2, the semiconductor device is an IGBT (Insulated Gate Bipolar Transistor), where the first electrode 310 is used as an emitter, and the second electrode lead-out region 160 includes a collector region 162 and a buffer region 161 located between the collector region 162 and the drift region 100; the buffer region 161 has the first conductivity type and the doping concentration of the buffer region 161 is greater than the doping concentration of the drift region 100, the collector region 162 has the second conductivity type, and the second electrode 320 is used as a collector electrode. Specifically, the second electrode lead-out region 160 is formed on the side of the drift region 100 which is away from the body region 110. In this embodiment, in the case of the semiconductor device is an IGBT, the first trench gate 121 extends into the drift region 100, and the extension region 150 surrounds the bottom of the first trench gate 121, which can not only adjust the electric field in the drift region, but also accelerate a recombination of the remaining charge carriers in the drift region 100 when the IGBT is turned off, thereby increasing the switching speed of the IGBT, and adjusting the switching characteristics of the device to optimize the device performance.

Figure 3:
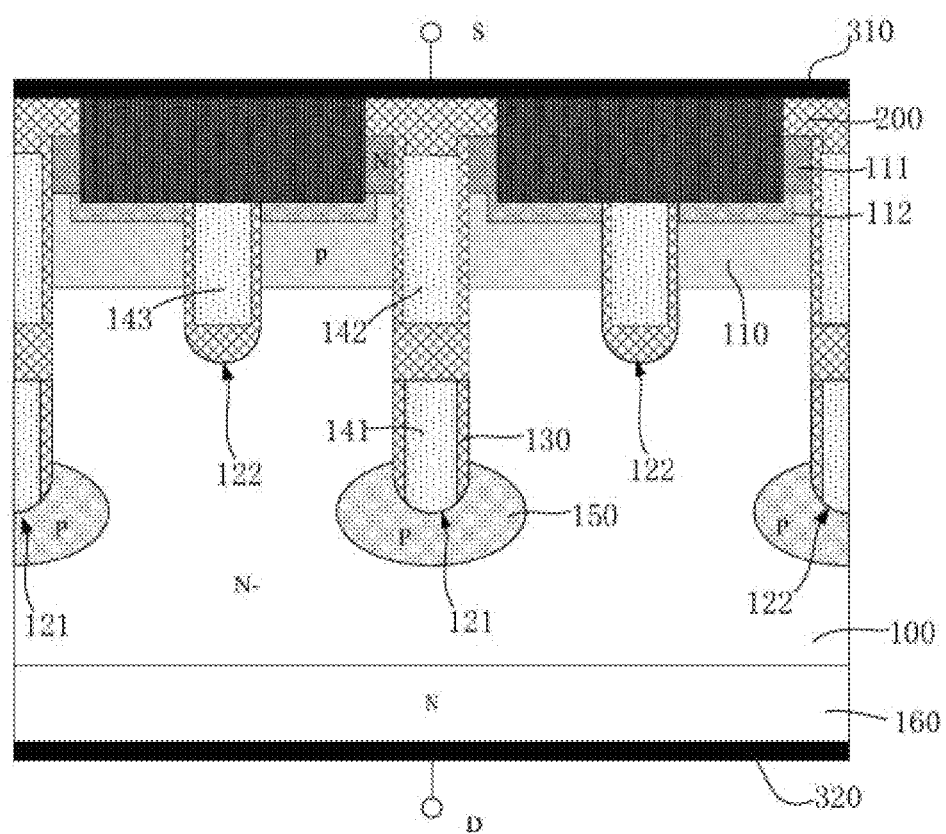
FIG. 3 shows a structure diagram in which the semiconductor device is a MOS transistor and the first conductive structure is in contact with the extension region.
Figure 4:
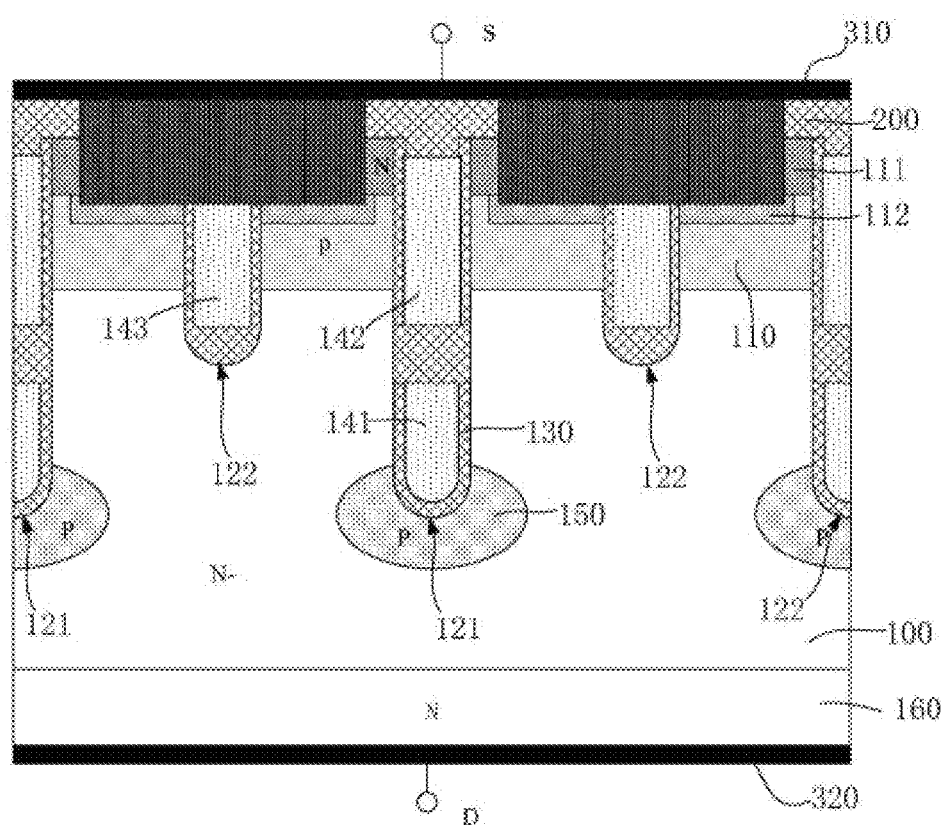
FIG. 4 shows a structure diagram in which the semiconductor device is the MOS transistor and the first conductive structure is isolated from the extension region.

In one embodiment, as shown in FIGS. 3 and 4, the semiconductor device may also be a MOS transistor, where FIG. 3 is a schematic structural diagram showing the contact between the first conductive structure 141 and the extension region 150; FIG. 4 is a schematic structural diagram showing the isolation of the first conductive structure 141 and the extension region 150. The first electrode 310 is used as a source electrode, the second electrode lead-out region 160 has the first conductivity type, specifically may be a semiconductor substrate having the first conductivity type, and the second electrode 320 is used as a drain electrode.

It should be noted that "N" and "P" in FIGS. 1 to 4 represent the conductivity types of the corresponding regions. In FIGS. 1 to 4, as an example, the first conductivity type may be N-type and the second conductivity type may be P-type; in other embodiments, the first conductivity type may be P-type and the second conductivity type may be N-type type.

Figure 5:
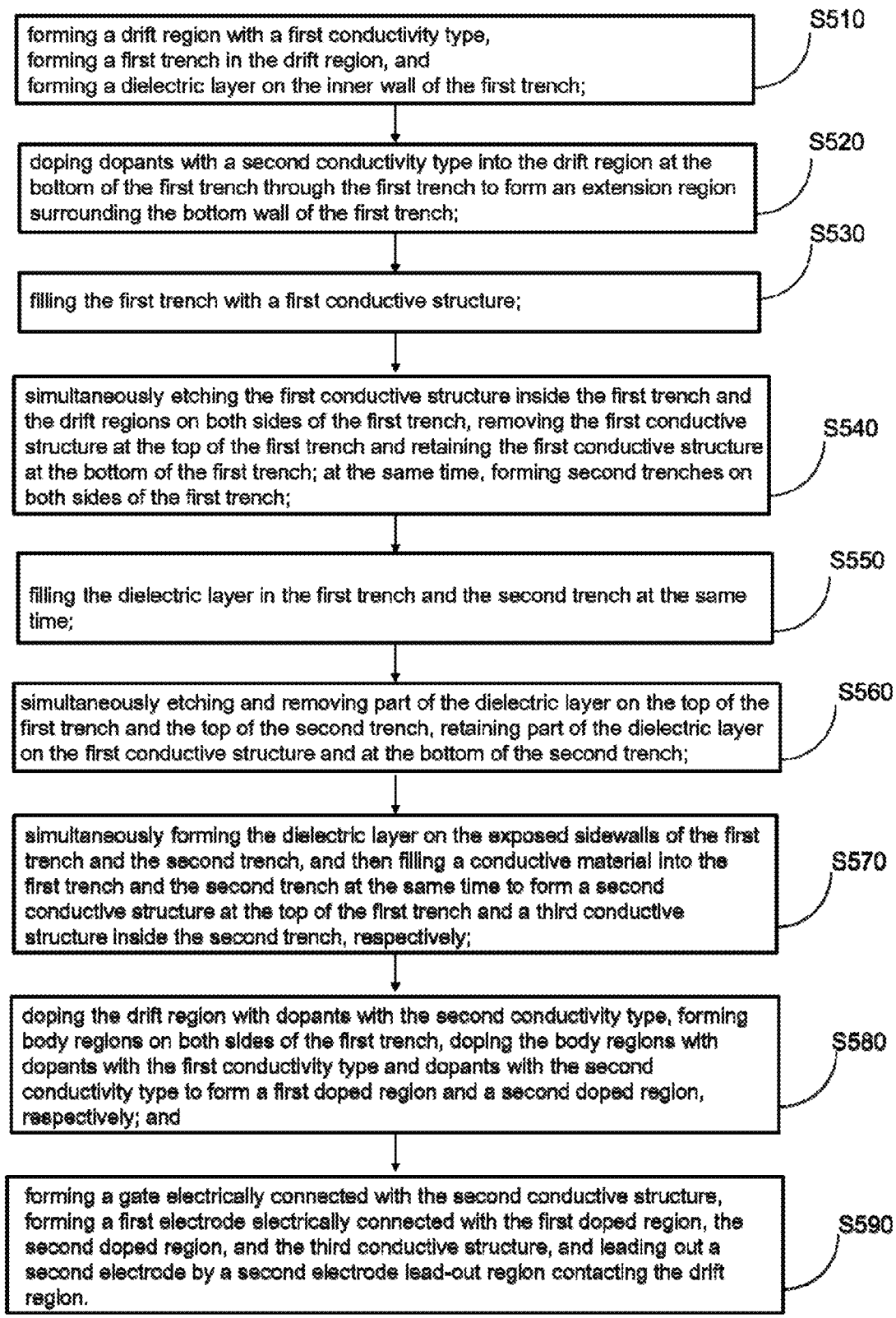
FIG. 5 shows a flow diagram of the steps in a method for preparing the semiconductor device.

The present application further provides a method for preparing semiconductor device. As shown in FIG. 5, the method includes the following steps:

Step S510: forming a drift region with a first conductivity type, forming a first trench in the drift region, and forming a dielectric layer on the inner wall of the first trench.

Figure 6A:
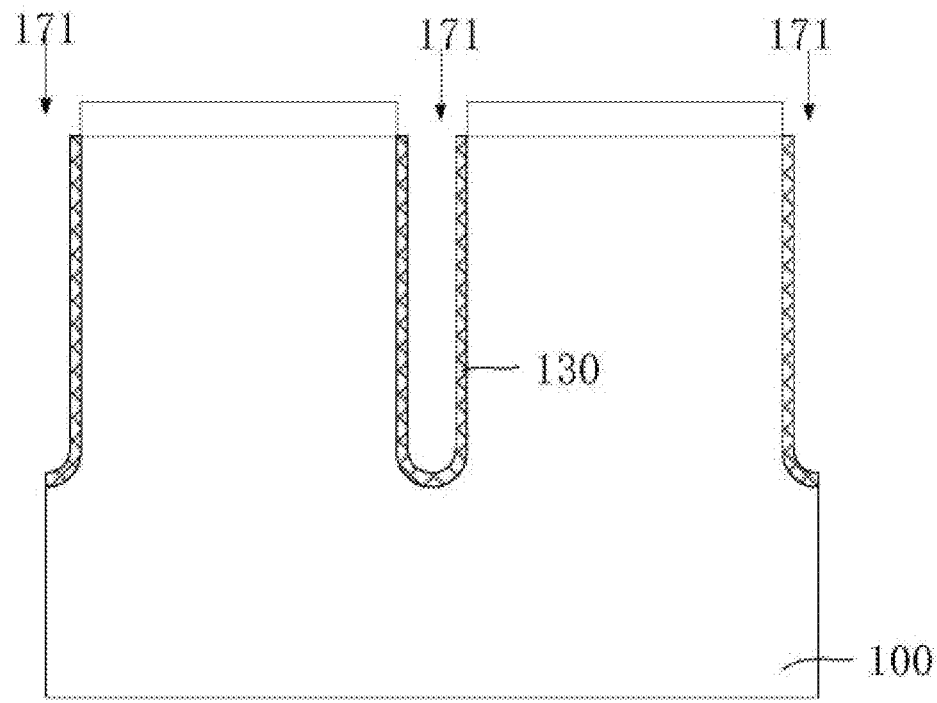
FIGS. 6a-6j show sectional views of the structures that are corresponded to the related steps in the method for preparing the semiconductor device according to an embodiment.

As shown in FIG. 6a, the drift region 100 with the first conductivity type can be formed on a semiconductor substrate (not shown in the figure) by epitaxial growth, the first trench 171 is formed in the drift region 100, and the dielectric layer 130 is formed on the inner wall of the first trench 171. The dielectric layer 130 may be an oxide layer, and specifically, the oxide layer may grow on the inner wall of the first trench 171 by a thermal oxidation process.

Step S520: doping the drift region at the bottom of the first trench with dopants with the second conductivity type through the first trench to form an extension region surrounding the bottom wall of the first trench.

Figure 6B:
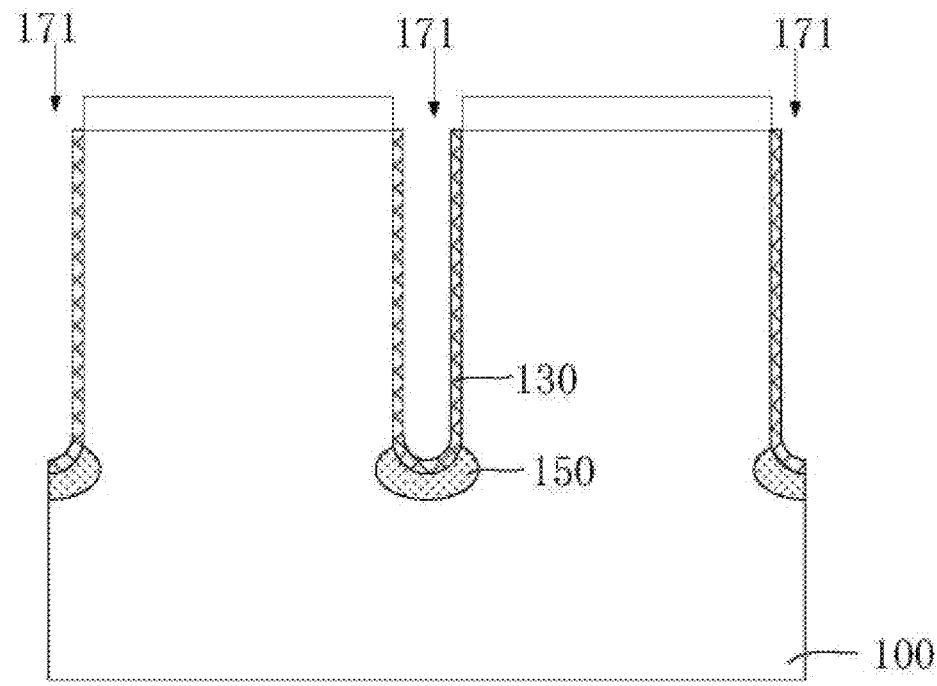

As shown in FIG. 6b, dopants with the second conductivity type are doped into the drift region 100 through the first trench 171 to form an extension region 150 surrounding and contacting with the bottom wall of the first trench 171.

Step S530: filling the first trench with a first conductive structure.

Figure 6C:
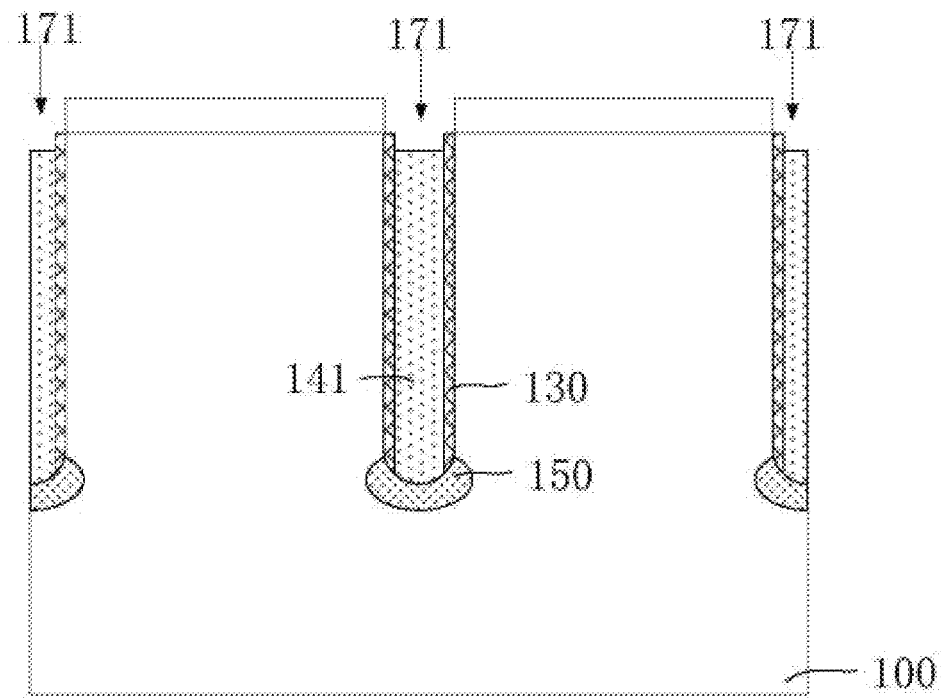

As shown in FIG. 6c, the first conductive structure 141 is filled into the first trench 171. Specifically, the first conductive structure 141 may be polysilicon.

In one embodiment, between step S520 and step S530, the method may further include:

Etching at least part of the dielectric layer on the bottom wall of the first trench surrounded by the extension region to expose the extension region.

Specifically, the dielectric layer 130 on the bottom wall of the first trench 171 may be dry-etched to form an opening exposing the extension region 150. In this case, in step S530, after the first conductive structure 141 is filled, the first conductive structure 141 is in contact with the extension region 150.

Step S540: Simultaneously etching the first conductive structure in the first trench and the drift regions on both sides of the first trench, removing the first conductive structure at the top of the first trench and retaining the first conductive structure at the bottom of the first trench; at the same time, forming second trenches on both sides of the first trench.

Figure 6D:
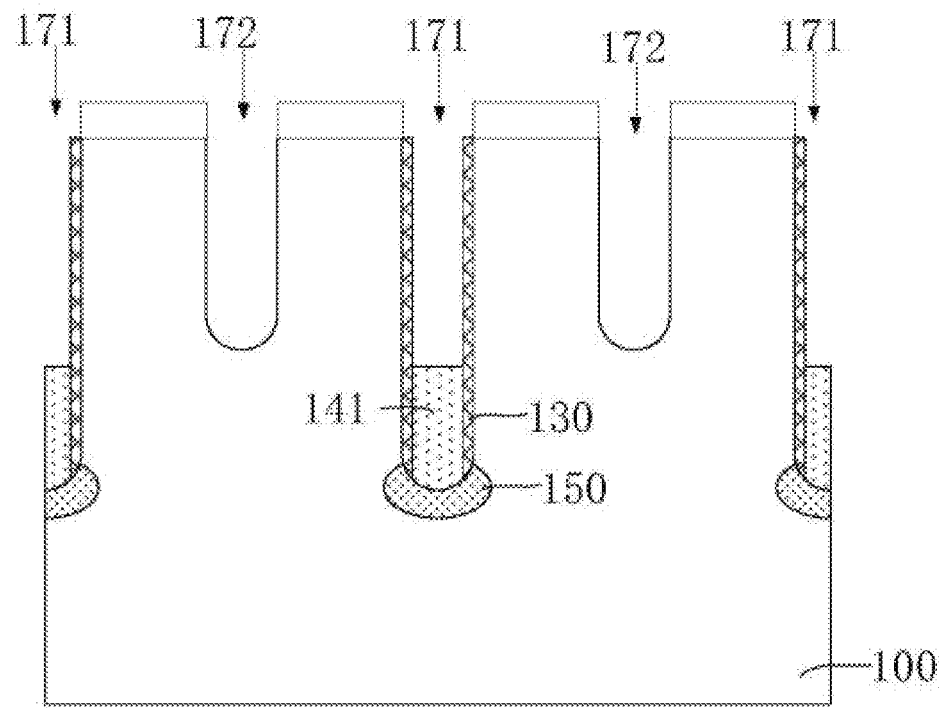

As shown in FIG. 6d, the first conductive structure 141 in the first trench 171 and the drift regions 100 on both sides of the first trench are etched simultaneously, the first conductive structure 141 on the top of the first trench 171 is removed and the first conductive structure 141 at the bottom of the first trench 171 is retained, and the second trenches 172 are formed on both sides of the first trench 171. Since the etching of the first conductive structure 141 and the etching of the drift region 100 are performed simultaneously, the etching depth of the first conductive structure 141 and that of the drift region 100 are the same in the etching process, i.e., the bottom of the second trench 172 is flush with the top of the remaining first conductive structure 141.

Step S550: filling the first trench and the second trench with the dielectric layer at the same time.

Figure 6E:
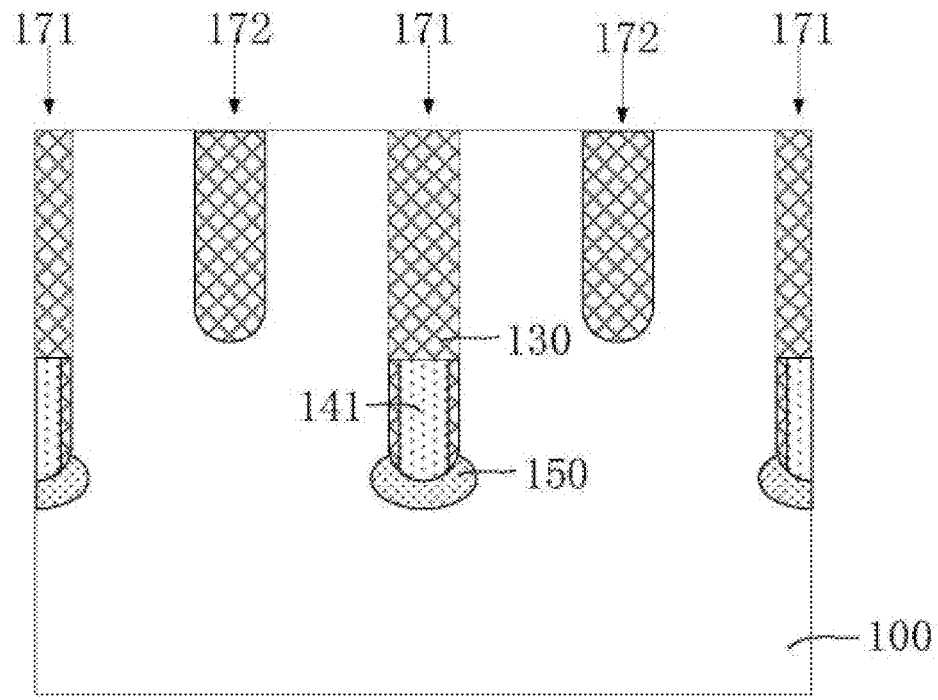

As shown in FIG. 6e, the first trench 171 and the second trench 172 are filled with the dielectric layer 130 at the same time. Specifically, a relatively thick dielectric layer 130 can be deposited by a deposition process to fill the first trench 171 and the second trench 172, and then the excess dielectric layer outside the trenches can be removed by a grinding process.

Step S560: Simultaneously etching and removing part of the dielectric layer on the top of the first trench and the top of the second trench, retaining part of the dielectric layer on the first conductive structure and at the bottom of the second trench.

Figure 6F:
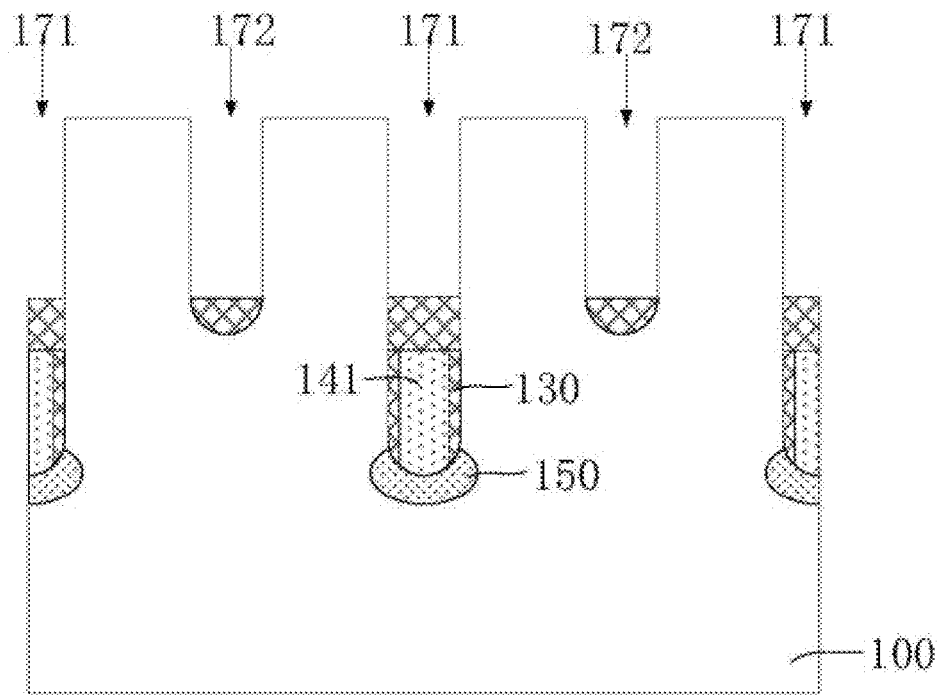

As shown in FIG. 6f, part of the dielectric layer on the top of the first trench 171 and the top of the second trench 172 is etched at the same time, and part of the dielectric layer on the first conductive structure 141 and at the bottom of the second trench 172 is retained.

Step S570: forming the dielectric layer on the exposed sidewalls of the first trench and the second trench at the same time, and then filling the first trench and the second trench with a conductive material at the same time to form a second conductive structure at the top of the first trench and a third conductive structure inside the second trench.

Figure 6G:
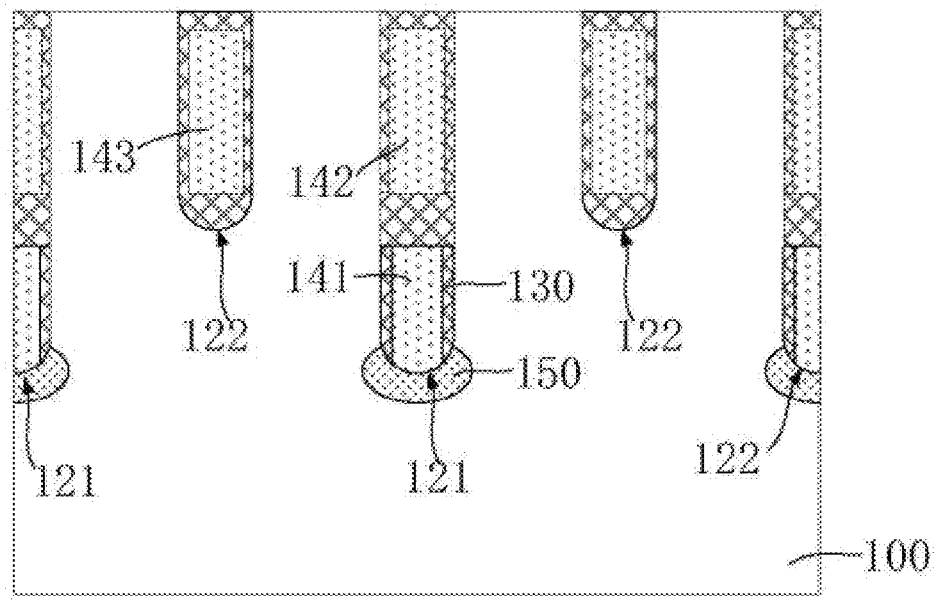

As shown in FIG. 6g, the dielectric layer is formed on the exposed sidewalls of the first trench 171 and the second trench 172 at the same time, and then the conductive material is filled into the first trench 171 and the second trench 172 at the same time, where the conductive material filled on the top of the first trench forms the second conductive structure 142, and the conductive material filled inside the second trench forms the third conductive structure 143. Specifically, the above-mentioned conductive material can also be polysilicon. In this case, the structure filled in the first trench 171 forms a trench gate 121, and the structure filled in the second trench 172 forms a trench regulatory region 122. The bottom of the trench gate 121 is surrounded by the extension region 150, and the depth of the trench gate 121 is greater than that of the trench regulatory region 122.

Step S580: doping the drift region with dopants with the second conductivity type, forming body regions on both sides of the first trench, and doping the body regions with dopants with the first conductivity type and dopants with the second conductivity type to form a first doped region and a second doped region, respectively.

The doping concentration of the second doped region is greater than that of the body region, and the second doped region is spaced apart from the first trench.

In one embodiment, between step S570 and step S580, the following steps are further included:

Forming a dielectric layer covering the second conductive structure 142 and the third conductive structure 143 on the top of the first trench 171 and the top of the second trench 143, respectively. Specifically, as shown in FIG. 6g, a portion of the second conductive structure 142 and the third conductive structure 143 located at the top of the trenches may be etched away, and then an oxide layer grows on the top of the second conductive structure 142 and the top of the third conductive structure 143 by thermal oxidation. In this embodiment, growing the oxide layer on the top of the second conductive structure 142 and the third conductive structure 143, can prevent dopants from being doped into the second conductive structure 142 and the third conductive structure 143 of the trenches during the doping process in step S580.

Figure 6H:
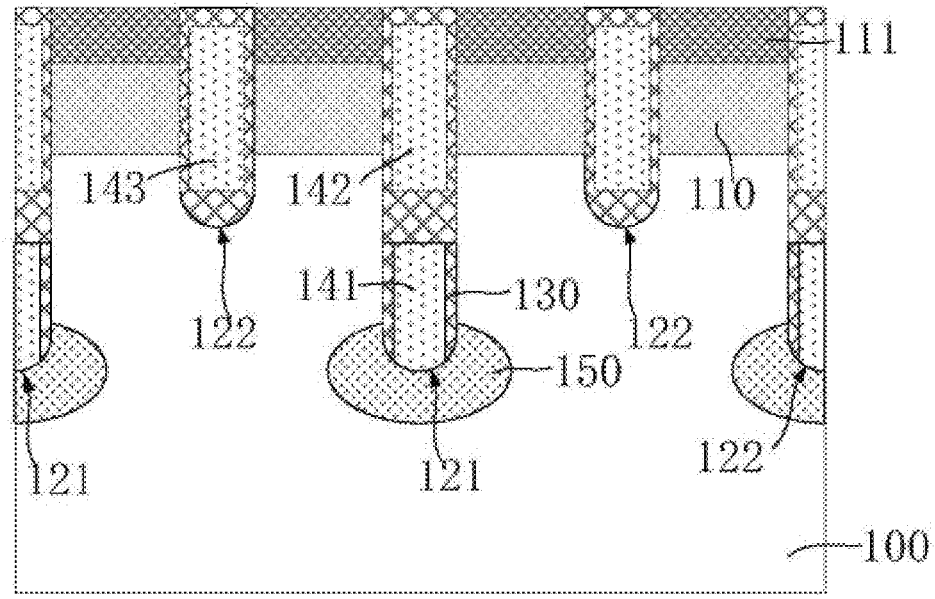

As shown in FIG. 6h, after the trench gate 121 and the trench regulatory region 122 are formed, the upper surface layer of the drift region 100 is doped with dopants with the second conductivity type. The body regions 110 contacting the sidewalls and the first trench 121 are formed on both sides of the first trench 121. Specifically, the depth of the body region 110 is less than or equal to the depth of the trench regulatory region 122.

In an embodiment, the process of forming the body region 110 is specifically a drive-in process at high temperature, where the temperature and time of the drive-in process can be adjusted according to the doping depth and doping concentration of the body region, specifically, the temperature of the drive-in process can be controlled within the range of 900° C.-1200° C., and the time of the drive-in process can be controlled within the range of 10 min-180 min. During the formation of the body region 110 by the drive-in process, the dopant ions of the extension region 150 diffuse outward, so that the extension region 150 is expanded outward, thereby increasing the volume of the extension region 150.

Figure 6I:
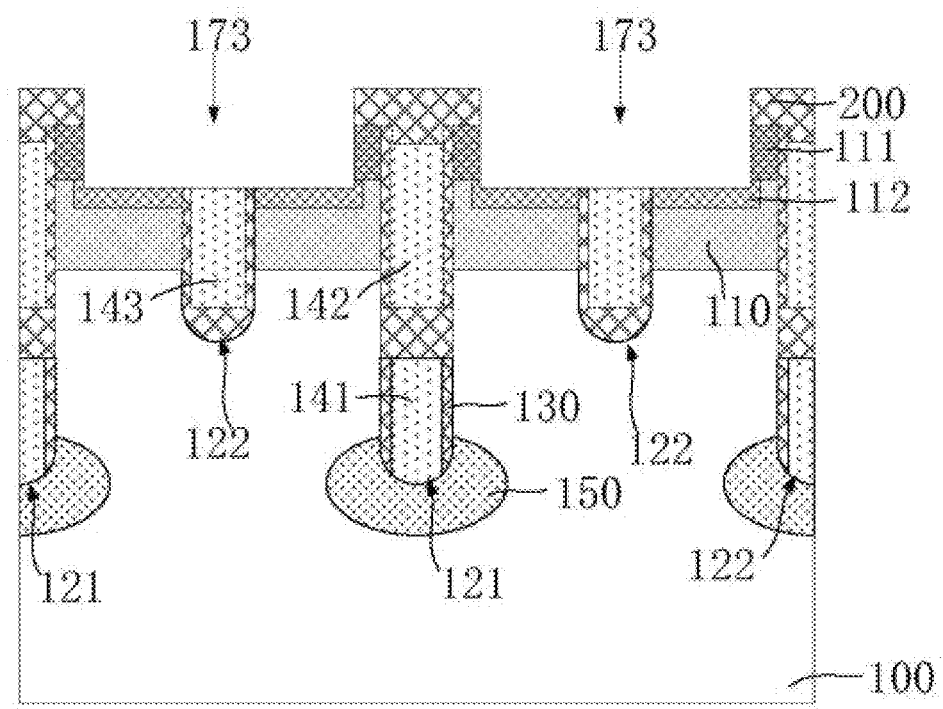

Specifically, the distributions of a first doped region 111 and a second doped region 112 may have various forms, and correspondingly, the processes for forming the first doped region 111 and the second doped region 112 may also have various options. In an embodiment, as shown in FIGS. 6h and 6i, the first doped region 111 is stacked on the second doped region 112, and the corresponding process steps may include:

A step S581, doping dopants with the first conductivity type on the upper surface layer of the body region 110 to form the first doped region 111 in contact with the first trench and the second trench.

A step S582, Etching the trench regulatory region 122 and a portion of the first doped region 111 on both sides of the trench regulatory region 122, so that the top of the trench regulatory region 122 reaches into the body region 110 to form a contact hole 173 exposing the third conductive structure 143 and the body region 110.

A step S583, doping the body region 110 with dopants with the second conductivity type through the contact hole 173 to form the second doped region 112.

Further, between step S581 and step S582, the following step is also included:

Forming an interlayer dielectric layer 200 on the trench gate 121, the trench regulatory region 122, and the first doped region 111. In step S582, before etching the trench regulatory region 122 and the first doped region 111, the interlayer dielectric layer 200 is etched.

Step S590: forming a gate electrically connected with the second conductive structure, forming a first electrode electrically connected with the first doped region, the second doped region and the third conductive structure, and leading out a second electrode through a second electrode lead-out region in contact with the drift region.

Figure 6J:
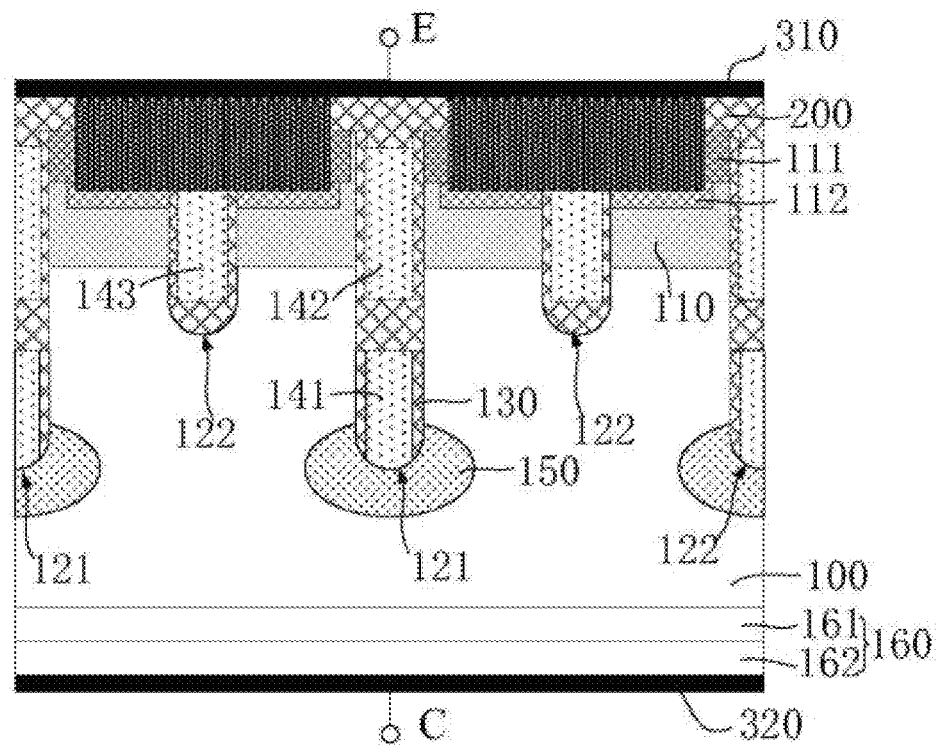

In one embodiment, as shown in FIG. 6j, the first electrode 310 and the gate (not shown in the figure) are formed, and the second electrode 320 is led out through the second electrode lead-out region 160.

In one embodiment, the first doped region 111 and the second doped region 112 are formed through the above-mentioned steps S581 to S583, and the contact holes penetrating the first doped region 111 and extending into the second doped region 112 are simultaneously formed, the first doped region 111, the second doped region 112 and the third conductive structure 143 are exposed through the contact holes 173. Therefore, when forming the first electrode 310, it can be electrically connected with the first doped region 111, the second doped region 112, and the third conductive structure 143 only through depositing one metal layer and filling the contact hole with the metal layer.

In one embodiment, as shown in FIG. 6j, the above-mentioned semiconductor device is specifically an IGBT, the first electrode 310 is used as an emitter, and the second electrode lead-out region 160 includes a collector region 162 and a buffer region 161 located between the collector region 162 and the drift region 100, and the second electrode lead-out region 160 may be formed in step S590. The buffer region 161 has the first conductivity type and the doping concentration of the buffer region 161 is greater than that of the drift region 100, the collector region 162 has the second conductivity type, and the second electrode 320 is used as a collector electrode. Specifically, the second electrode lead-out region 160 is formed on the side of the drift region 100 which is away from the body region 110.

In an embodiment, as shown in FIG. 3 and FIG. 4, the semiconductor device may also be a MOS transistor. The first electrode 310 is used as a source electrode, the second electrode lead-out region 160 has the first conductivity type, specifically can be a semiconductor substrate having the first conductivity type, and the second electrode 320 is used as a drain electrode.

In the above-mentioned method for preparing semiconductor device, the trench gate 121 and the trench regulatory region 122 are formed in the cellular region, where the upper half part of the trench gate 121 forms a gate structure, and the lower half part of the trench gate 121 and the trench regulatory region 122 are used as an inner field plate. Meanwhile, the bottom of the trench gate 121 is surrounded by the extension region 150, and the conductivity type of the extension region 150 is opposite to that of the drift region 100. Therefore, under the combined action of the above-mentioned inner field plate and the extension region, the depletion of the drift region can be enhanced, thereby increasing the breakdown voltage of the drift region. On the other hand, the extension region 150 surrounding the bottom of the first trench can transfer the breakdown position from the trench gate to the interface of the extension region 150 and the drift region 100, thereby making the breakdown more stable. At the same time, since the trench regulatory region 122 and the upper part of the first trench have the same structure, in the preparing process, after the first conductive structure 141 is formed and the dielectric layer is filled in the first trench, the trench regulatory region 122 and the part inside the first trench and located on the first conductive structure 141 can be simultaneously formed, thereby saving process cost.

The above embodiments are only used to illustrate several implementations of the present application, and the descriptions thereof are specific and detailed, but should not be construed as a limitation on the scope of the present invention. It should be pointed out that for those skilled in the art, without departing from the concept of the present application, several modifications and improvements can be made, which all belong to the protection scope of the present application. Therefore, the scope of protection of the present application should be subject to the appended claims.

What is claimed is:

1. A semiconductor device, comprising:
a drift region with a first conductivity type;
a body region with a second conductivity type, formed in the drift region;
a first doped region and a second doped region, respectively formed in the body region, wherein the first doped region has the first conductivity type, the second doped region has the second conductivity type;
a trench gate and an extension region, wherein the trench gate is formed by filling a first trench, the first trench penetrates the first doped region and the body region, and extends to the drift region; the extension region has the second conductivity type and is formed in the drift region located under the first trench, and surrounds the bottom wall of the first trench; the trench gate comprises a first conductive structure at the bottom of the first trench and a second conductive structure at the top of the first trench, a dielectric layer formed between the second conductive structure and the inner wall of the first trench, as well as between the first conductive structure and the inner wall of the first trench not surrounded by the extension region; wherein the first conductive structure and the second conductive structure are isolated from each other, and the first conductive structure has a floating structure;
a trench regulatory region, formed by filling a second trench, wherein the second trench penetrates the first doped region and the body region, and extends into the drift region, the trench regulatory region comprises a third conductive structure inside the second trench and the dielectric layer between the third conductive structure and the inner wall of the second trench;
a gate, electrically connected with the second conductive structure;
a first electrode, electrically connected with the first doped region, the second doped region, and the third conductive structure;
a second electrode lead-out region, in contact with the drift region; and
a second electrode, electrically connected with the second electrode lead-out region.

2. The semiconductor device according to claim 1, wherein the trench gates and the trench regulatory regions are alternately arranged side by side, and the intervals between adjacent trenches are equal.

3. The semiconductor device according to claim 1, wherein the depth of the first trench is greater than the depth of the second trench.

4. The semiconductor device according to claim 1, wherein the bottom of the second trench is flush with the top of the first conductive structure.

5. The semiconductor device according to claim 1, wherein the first doped region and the second doped region are arranged side by side, the first doped region and the second doped region are both formed on the upper surface layer of the body region, and the second trench extends downward from the top surface of the body region to the drift region, and the first doped region, the second doped region, and the third conductive structure in the second trench are led out through different contact holes respectively and electrically connected with the first electrode.

6. The semiconductor device according to claim 1, wherein the first doped region is formed on an upper surface layer of the body region, the second doped region is formed below the first doped region; the second trench sequentially penetrates the second doped region and the body region and extends into the drift region; a contact hole penetrating the first doped region and exposing the second doped region and the third conductive structure is formed on the second trench, and the first electrode is electrically connected with the first doped region, the second doped region, and the third conductive structure respectively through the contact hole.

7. The semiconductor device according to claim 1, wherein the dielectric layer is not formed on at least a portion of the bottom wall of the first trench surrounded by the extension region, then the extension region is in contact with the first conductive structure.

8. The semiconductor device according to claim 1, wherein the dielectric layer is formed on the entire bottom wall of the first trench surrounded by the extension region, then the extension region is isolated from the first conductive structure.

9. The semiconductor device according to claim 1, wherein the first conductive structure is electrically connected with the first electrode.

10. The semiconductor device according to claim 1, wherein the semiconductor device is an IGBT, the first electrode is used as an emitter; the second electrode lead-out region comprises a collector region and a buffer region located between the collector region and the drift region; the buffer region has the first conductivity type, the collector region has the second conductivity type; the doping concentration of the buffer region is greater than that of the drift region; and the second electrode is used as a collector electrode.

11. The semiconductor device according to claim 1, wherein the semiconductor device is a MOS transistor, the first electrode is used as a source electrode, the second electrode lead-out region has the first conductivity type, and the second electrode is used as a drain electrode.

12. A method for preparing semiconductor device, comprising:
    forming a drift region with a first conductivity type, forming a first trench in the drift region, and forming a dielectric layer on the inner wall of the first trench;
    doping dopants with a second conductivity type into the drift region at the bottom of the first trench through the first trench to form an extension region surrounding the bottom wall of the first trench;
    filling the first trench with a first conductive structure;
    simultaneously etching the first conductive structure inside the first trench and the drift regions on both sides of the first trench, removing the first conductive structure at the top of the first trench and retaining the first conductive structure at the bottom of the first trench; at the same time, forming second trenches on both sides of the first trench;
    filling the dielectric layer in the first trench and the second trench at the same time;
    simultaneously etching and removing part of the dielectric layer on the top of the first trench and the top of the second trench, retaining part of the dielectric layer on the first conductive structure and at the bottom of the second trench;
    simultaneously forming the dielectric layer on the exposed sidewalls of the first trench and the second trench, and then filling a conductive material into the first trench and the second trench at the same time to form a second conductive structure at the top of the first trench and a third conductive structure inside the second trench, respectively;
    doping the drift region with dopants with the second conductivity type, forming body regions on both sides of the first trench, doping the body regions with dopants with the first conductivity type and dopants with the second conductivity type to form a first doped region and a second doped region, respectively; and
    forming a gate electrically connected with the second conductive structure, forming a first electrode electrically connected with the first doped region, the second doped region, and the third conductive structure, and leading out a second electrode by a second electrode lead-out region contacting the drift region.

13. The method according to claim 12, further comprising:
    etching at least part of the dielectric layer on the bottom wall of the first trench surrounded by the extension region to expose the extension region before the filling the first trench with a first conductive structure.

14. The method according to claim 12, wherein doping the body regions with dopants with the first conductivity type and dopants with the second conductivity type to form a first doped region and a second doped region, respectively, comprising:
    doping dopants with the first conductivity type on the upper surface layer of the body region to form the first doped region in contact with the first trench and the second trench;
    etching the trench regulatory region and a portion of the first doped region on both sides of the trench regulatory region, so that the top surface of the trench regulatory region reaches into the body region to form a contact hole exposing the third conductive structure and the body region; and
    doping the body region with dopants with the second conductivity type through the contact hole to form the second doped region, and connecting the first electrode electrically with the first doped region, the second doped region, and the third conductive structure respectively through the contact hole.

* * * * *